United States Patent [19]

Doxsee

[11] Patent Number: 5,853,686
[45] Date of Patent: *Dec. 29, 1998

[54] CALCIUM CARBONATES OF ALTERED CRYSTAL HABIT OR MORPHOLOGY AND METHODS FOR PRODUCING SAME

[75] Inventor: Kenneth M. Doxsee, Eugene, Oreg.

[73] Assignee: State of Oregon acting by and through the Oregon State Board of Higher Education on behalf of the University of Oregon, Eugene, Oreg.

[*] Notice: The term of this patent shall not extend beyond the expiration date of Pat. No. 5,545,394.

[21] Appl. No.: 695,800

[22] Filed: Aug. 12, 1996

Related U.S. Application Data

[63] Continuation-in-part of Ser. No. 104,863, Aug. 10, 1993, Pat. No. 5,545,394.

[51] Int. Cl.$^6$ .............................. C01F 11/18; B01D 9/00
[52] U.S. Cl. ......................... 423/430; 423/431; 23/300; 23/304
[58] Field of Search .................................. 423/430, 431; 23/300, 304

[56] References Cited

U.S. PATENT DOCUMENTS

| | | | |
|---|---|---|---|
| 4,018,875 | 4/1977 | Jordan | 423/430 |
| 4,157,379 | 6/1979 | Arika et al. | 423/430 |
| 4,237,147 | 12/1980 | Merten et al. | 423/430 |
| 4,308,031 | 12/1981 | Au | 23/293 R |
| 4,347,230 | 8/1982 | Nicolau | 423/491 |
| 4,436,664 | 3/1984 | Gokel | 260/330.6 |
| 4,474,963 | 10/1984 | Gokel | 549/352 |
| 4,687,844 | 8/1987 | Gokel et al. | 540/467 |
| 4,714,603 | 12/1987 | Vanderheiden | 423/430 |
| 5,007,964 | 4/1991 | Tsukisaha et al. | 423/430 |
| 5,164,172 | 11/1992 | Katayama et al. | 423/430 |
| 5,269,818 | 12/1993 | Kunesh et al. | 423/430 |
| 5,290,353 | 3/1994 | Goffin et al. | 423/430 |
| 5,320,822 | 6/1994 | Ozin et al. | 423/700 |

OTHER PUBLICATIONS

Doxsee et al., "Complexation–Mediated Crystallization of Sodium Acetate Trihydrate Needles from Cyclohexane Solution," *J. Inclusion Phenom.* 9 : 327–336 (1990).

Doxsee et al., "Unusual Coordination Number and Geometry in a Potassium 18—Crown —6 Complex," *J. Am. Chem. Soc.* 114 : 5165–5171 (1992).

Bianconi et al., "Crystallization of an Inorganic Phase Controlled by a Polymer Matrix," *Nature* 349 : 315–317 (1991).

Nicolau, "Solution Growth of Sparingly Soluble Single Crystals from Soluble Complexes—I. General Introduction," *J. Crystal Growth* 48: 45–50 (1980).

Nicolau, "Solution Growth of Sparingly Soluble Single Crystals from Soluble Complexes —II. Growth of α–HgI$_2$ Single Crystals from Iodomercurate Complexes," *J. Crystal Growth* 48 :51–60 (1980).

(List continued on next page.)

*Primary Examiner*—Gary P. Straub
*Attorney, Agent, or Firm*—Klarquist Sparkman Campbell Leigh & Whinston, LLP

[57] ABSTRACT

Methods are disclosed in which first and second reactant salts and, optionally, a complexing agent are added to a non-aqueous reaction solvent to form a reaction system. The reactant salts, which are substantially soluble and reactive with each other in water to form a first crystallite of calcium carbonate, are present in the reaction solvent in relative amounts that are sufficient to form a desired amount of the calcium carbonate in the reaction system. The complexing agent, if present, is a crown ether or other cyclic or acyclic polydentate chelating agent that, in the reaction solvent, forms chelation complexes with at least one of the reactant salts. Reaction of the first and second reactant salts in the reaction solvent forms a second crystallite precipitate comprising crystals of calcium carbonate having a different habit or morphology from calcium carbonate crystals in the first crystallite that would otherwise be formable in water by reaction of similar amounts of the first and second reactant salts.

16 Claims, 3 Drawing Sheets

OTHER PUBLICATIONS

Nicolau et al., "Solution Growth of Sparingly Soluble Single Crystals from Soluble Complexes —III. Growth of α–$HgI_2$ Single Crystals from Dimethylsulfoxide Complexes," *J. Crystal Growth 48* :61–73 (1980).

Boulin, et al., "Gel–Growth of Silver Acetate Crystals," *J. Crystal Growth 6* :290–292 (1970).

Armington, et al., "Recrystallization by Shifting the Equilibrium of Chemical Complexes —The Growth of Cinnabar," *J. Crystal Growth 6* :278–280 (1970).

CALCIUM CARBONATES OF ALTERED CRYSTAL HABIT OR MORPHOLOGY AND METHODS FOR PRODUCING SAME

CROSS REFERENCE TO RELATED APPLICATION

This application is a continuation-in-part of U.S. patent application Ser. No. 08/104,863, filed on Aug. 10, 1993, which issued as U.S. Pat. No. 5,545,394 on Aug. 13, 1996.

ACKNOWLEDGMENT

Research that resulted in this invention was supported by grant no. N-00014-91-J-1731 from the Office of Naval Research. The government has rights in this invention.

FIELD OF THE INVENTION

This invention pertains to new crystalline forms of calcium carbonate compounds and methods for their preparation.

BACKGROUND OF THE INVENTION

Interest in crystallization, and in various ways for altering the shapes and structures of crystals, has a long history because an extraordinary range of physical and chemical properties of crystalline solid-state materials is dictated to a large extent by their crystal form and size. Efforts to modify crystallization processes so as to generate new crystalline forms of substances continue to be of considerable importance for various reasons including, for example, improvement of mass-handling characteristics of particulate materials, production of materials that are stronger or more durable than existing materials, and production of materials having improved physical characteristics such as light transmissivity.

Conventional ways of altering the shape (i.e., the "habit") or the crystal lattice (i.e., the "morphology") of a crystalline material include: (1) using additives (Weissbuch et al., *Science* 253:637, 1991; Addadi et al., *Topics in Stereochem.* 16:1, 1986; Addadi et al., *Angew. Chem. mnt. Ed. Engl.* 24:466, 1985; and Addadi et al., *Nature* 296:21, 1982); and (2) changing the crystallization solvent (including crystallization from the gas phase) used to dissolve the crystallization solute. Unfortunately, these methods are not universally applicable and frequently do not produce the desired form of a compound.

U.S. Pat. No. 5,545,394 to Doxsee, incorporated herein by reference, is directed, inter alia, to methods for forming crystallite products by chemical reaction. A representative method involves a reaction between a first and a second reactant salt in an organic solvent in the presence of a complexing agent. The first reactant salt is substantially soluble in water but is poorly soluble to insoluble in the organic solvent. The second reactant salt is reactive with the first reactant salt in water to form a first crystallite of a product compound. The complexing agent is soluble in the organic solvent and can form chelation complexes with the first reactant salt so as to facilitate, for example, dissolution of the first reactant salt in the organic solvent. The reaction results in formation of a second crystallite, substantially insoluble in the organic solvent, comprising crystals of the product compound that have a different habit or morphology from crystals of the product compound in the first crystallite that otherwise would be formable in water by reaction of the first and second reactant salts without the complexing agent.

Many salts that are substantially soluble in water are poorly soluble to insoluble in many organic solvents. Solvent effects on the alteration of crystal growth of such salts have not been explored to any great extent simply because one must dissolve the salt before it can be crystallized from solution. Calcium carbonate is second only to silica in the mineral kingdom in terms of natural abundance. Berry et al., *Mineralogy*, 2d ed., ch. 12, Freeman, San Francisco, 1983. It represents an important commercial product, particularly in the paper and plastics industries, where it serves as a filler, and in the pharmaceutical industry, where it often serves as a binder. Carr et al., in Howe-Grant (ed.), *Kirk-Othmer Encyclopedia of Chemical Technology*, 4th ed., pp. 796–801, Wiley, New York, 1992. Calcium carbonate also occupies a position of prominence as the most common biomineral, serving as a primary structural component in 23 of the 31 phyla of organisms that use biominerals. Lowenstam et al., *On Biomineralization*, ch. 1, Oxford Univ. Press, New York, 1989.

Three anhydrous phases of calcium carbonate are known: calcite, aragonite, and vaterite (Eriksson, *Rocks and Minerals* 70:217–231, 1995; and Deer et al., *An Introduction to the Rock-Forming Minerals*, pt. 5, ch. 5, Wiley, New York, 1966), and development of control over and understanding of the formation of these phases, as well as over crystal habit (form) remain important issues both in industry and in the research area of biomineralization.

The crystallization of calcium carbonate has been heavily studied. Sabbides et al., *J. Crystal Growth* 133:13–22, 1993; Brown et al., *J. Colloid Interface Sci.* 160:372–379, 1993; Wakita et al., *J. Crystal Growth* 71:807–809, 1985; and Henisch, *Crystals in Gels and Liesegang Rings*, Cambridge Univ. Press, 1988. Nevertheless, there remains an urgent need for other forms of calcium carbonate.

Therefore, there is a need for methods for producing, via reaction-crystallization, calcium carbonates comprising crystals that are different in habit and/or morphology from calcium carbonates produced by simple crystallization from aqueous solution. There is also a need for calcium carbonates having altered habit and/or morphology.

SUMMARY OF THE INVENTION

The foregoing needs are met by the present invention that provides, inter alia, methods and reaction systems for forming calcium carbonate crystallites having altered habit and/or morphology. Also provided are calcium carbonate crystallites formed by such methods.

In a general method according to the present invention, first and second reactant salts are added to a non-aqueous reaction solvent to form a reaction system. The reactant salts are substantially soluble and reactive with each other in water to form a first crystallite of calcium carbonate, and are added to the reaction solvent in relative amounts that are sufficient for reaction of the first and second reactant salts with each other in the reaction system to form a desired amount of the calcium carbonate.

A complexing agent can also be added to the reaction solvent along with the first and second reactant salts. The complexing agent, if present, is soluble in the reaction solvent and is selected from a group consisting of crown ethers and other cyclic and acyclic polydentate chelating agents. Also, the complexing agent, if present, is capable of forming chelation complexes with at least one of the reactant salts in the reaction solvent.

In the reaction system, the first and second reactant salts are allowed to react with each other to form a second crystallite precipitate. The second crystallite comprises crystals of calcium carbonate that have a different habit or morphology from calcium carbonate crystals in the calcium carbonate in the first crystallite that would otherwise be formable in water by reaction of similar amounts of the first and second reactant salts.

The foregoing and other features and advantages of the present invention readily can be ascertained from the following description and accompanying drawings.

DETAILED DESCRIPTION

Figure 1:
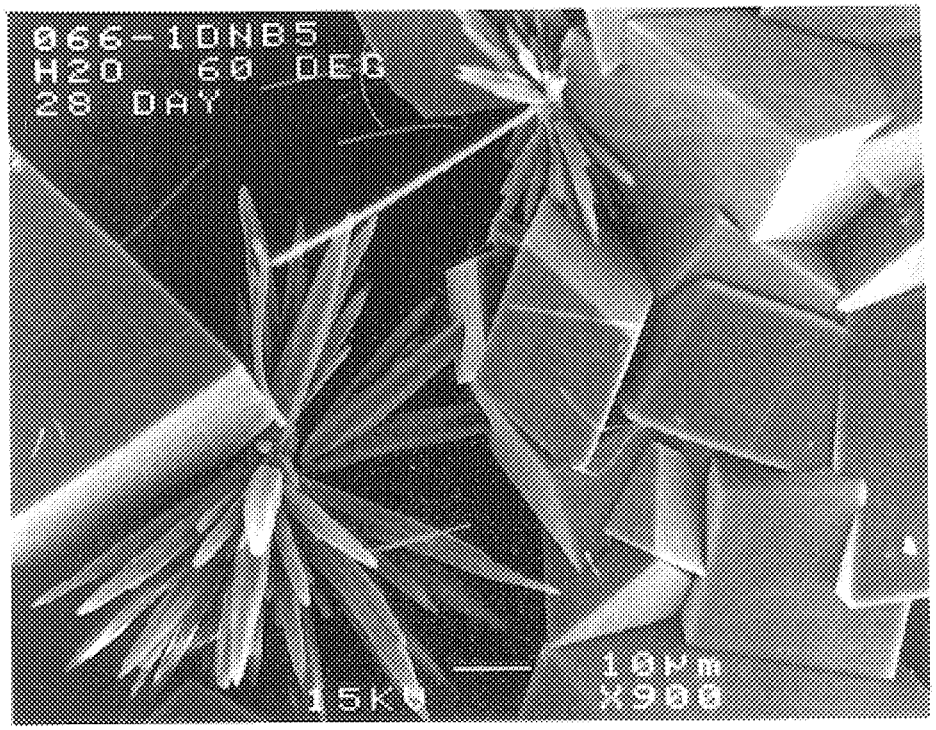
FIG. 1 is a photograph of calcium carbonate crystals formed by reaction of calcium chloride with sodium bicarbonate in aqueous solution according to the prior art.

"Complexation-mediated crystallization" is discussed in Doxsee et al., *J. Inclus. Phenom. & Molec. Recog. in Chem.* 9:327–336 (1990), incorporated herein by reference. In such methods, a complexing agent (e.g., a crown ether that is soluble in a non-aqueous solvent) is used to facilitate dissolution of a salt, freely soluble in water, in the non-aqueous solvent, wherein the salt is subsequently crystallized from the non-aqueous solvent. During the dissolution step, molecules of the complexing agent form complexes with one or more of the constituent ions of the salt, thereby enabling the salt to "dissolve" (while still complexed with the crown ether) in the non-aqueous solvent. Subsequent evaporation of the solvent results in crystallization of the salt. With respect to an example involving sodium acetate, rather than a typical hexagonal plate habit characteristic of sodium acetate trihydrate crystals formed from aqueous solution, the crystals formed in the non-aqueous solvent have a needle shape but have the same lattice parameters as hexagonal plate crystals of sodium acetate. The non-aqueous solvent apparently exerts a pronounced salvation effect on the relatively non-polar lateral crystal faces (on which van der Waals contacts between methyl groups of the acetates apparently predominate) but comparatively little salvation effect on the relatively polar axial faces (built up of alternating layers of $Na^+$ions, water molecules, and acetate carboxylates). Thus, the axial faces are caused to grow more rapidly than the lateral faces.

The present invention provides a way to produce crystalline calcium carbonates (i.e., "crystallites" of calcium carbonate) by chemical reaction, not merely by recrystallization from a solution. In a reaction according to the present invention, product calcium carbonate crystals are formed that have an altered crystal shape (crystal habit) and/or crystal lattice structure (crystal morphology) compared to calcium carbonate crystals formed by conventional methods.

A "reaction system" for forming calcium carbonates according to the present invention comprises: (1) reactant salts capable of forming calcium carbonate by chemical reaction, and (2) a non-aqueous solvent (termed herein the "reaction solvent") in which one or more of the reactant salts are to be dissolved (but in which one or more of the reactant salts may not be freely soluble). Especially if at least one of the reactant salts is poorly soluble to insoluble in the reaction solvent, a "complexing agent" suitable for effecting dissolution of at least one of the reactant salts in the non-aqueous solvent can be included in the reaction system. (Even if the reactant salts are adequately soluble in the reaction solvent, a complexing agent can be included in the reaction system to effect a change in crystal habit or morphology relative to a reaction solvent without a complexing agent and/or relative to a control reaction involving the same reactant salts but performed in an aqueous solvent.) The reactant salts, reaction solvent, and complexing agent are discussed in further detail below.

A chemical reaction according to the present invention involves molecules and/or ions of at least two reactant salts that are presented to each other for reaction while in a dissolved condition. Interaction of the reactant salts can occur by interdiffusion which can occur in a completely liquid medium or in a supported medium such as a gel. (Examples of growth of calcium carbonate in a gel can be found in Examples 45 and 46 of U.S. Pat. No. 5,545,394, incorporated herein by reference, in which the calcium source was calcium chloride, the carbonate source was ammonium carbonate, and the gel was a poly(vinylchloride) gel in dimethylsulfoxide.)

Whenever dissolution of a reactant salt in the reaction solvent is facilitated by use of a complexing agent, it is not necessary that all the reactant salt be dissolved before the onset of reaction. The complexing agent is typically not consumed during the reaction and can therefore serve as a "dissolution catalyst" for the corresponding reactant salt. As molecules or ions of the reactant salt dissociate from molecules of the complexing agent and become incorporated into the calcium carbonate product, the liberated molecules of the completing agent become free to facilitate dissolution of more of the remaining unreacted reactant salt. Thus, the complexing agent can be present in a "catalytic" (i.e., sub-stoichiometric) amount in the reaction system.

As the reaction progresses, the calcium carbonate product forms as one or more crystalline masses (crystallites) that precipitate and are thus readily separable from the reaction solvent using conventional separation techniques. The crystallite can be comprised of visually discernable crystals or of crystals that are so small that the crystallite appears to be amorphous.

A key factor in determining whether or not a reactant salt will dissolve in a particular reaction solvent is the polarity of the molecules or ions of the reactant salt relative to molecules of the reaction solvent. In general, reactant salts having polar moieties have a higher solubility in polar solvents compared to reactant salts having mostly substantially non-polar moieties. Thus, at a given temperature, a greater amount of a polar reactant salt will dissolve in a polar solvent than in a relatively less polar solvent. The complexing agent, by bonding to the reactant salt, can substantially alter the polarity of the reactant salt, usually by making the molecules (or constituent ions) of the reactant salt less polar.

Most reactant salts usable for producing calcium carbonate are normally soluble in water and have either limited solubility or substantial insolubility in less polar solvents.

As used herein, a "non-aqueous reaction solvent" is a solvent other than substantially pure water. In order to dissolve a reactant salt in such a solvent sufficiently for the desired reaction to occur between reactant salts, a complexing agent can be used that is soluble in the non-aqueous reaction solvent and that can form a complex with the reactant salt to be dissolved in the non-aqueous reaction solvent.

It is possible for a first reactant salt to be soluble in the reaction solvent and a second reactant salt to have limited solubility in the reaction solvent. In such an instance, a complexing agent can be used to facilitate dissolution of the second reactant salt in the reaction solvent.

It is also possible for both reactant salts to be soluble in the reaction solvent. In such an instance, the complexing agent can be used to alter the habit and/or morphology of the crystallite product.

Reaction systems according to the present invention also encompass systems in which both the first and second reactant salts require complexing agents for dissolution. The complexing agents can be the same or different. In a representative example of such a system, a first solution containing a first complexed reactant salt is layered atop a second solution containing a second complexed reactant salt, wherein the reaction occurs at the interface of the first and second solutions. Additional "phases" are also possible.

It is not necessary that the reaction system comprise a phase interface at all. "Single-phase" reactions in a single reaction solvent comprising all the reactant salts are within the scope of the present invention.

The complexing agent performs at least one of the following roles: (a) solubilizing a reactant salt in the reaction solvent; and (b) influencing the habit and/or morphology of the crystalline calcium carbonate product formed in the reaction solvent, presumably by affecting the differential rates of growth of certain crystal faces relative to other crystal faces. In reaction systems in which both reactant salts, in the absence of the complexing agent, are insoluble in the reaction solvent, the complexing agent generally performs both roles. In reaction systems in which one reactant salt is insoluble in the reaction solvent and requires complexation with the complexing agent in order to be dissolved in the reaction solvent, but the other reactant salt is soluble in the reaction solvent, the complexing agent again performs both roles. In reaction systems in which both reactant salts are sufficiently soluble in the reaction solvent for the reaction to occur, the complexing agent serves mainly the second role.

A molecule of the complexing agent can facilitate dissolution of a molecule or ion of a reactant salt by forming a chelation complex with the molecule or ion. Due largely to the solubility of the complexing agent in the reaction solvent, the resulting complex is also soluble in the reaction solvent. Such complex formation can be exemplified by envisioning formation of a chelate, as known in the art, comprising a molecule of the complexing agent (serving as a chelating agent) interacting with a molecule or ion of the reactant salt in a non-covalent way (i.e., by dative bonding) so as to form a coordination compound. In such a coordination compound, a molecule or ion of the reactant salt is attached by multiple coordination links to two or more usually non-metal atoms in the complexing-agent molecule. Complexing agents offering two groups for attachment to the ion are termed "bidentate;" complexing agents offering three groups are termed "tridentate," and so on. The chemical groups on the complexing agent that participate in bonding of the reactant salt are typically electron-donors. Complexing agents are also termed "ligands" in the art.

As can be surmised from the foregoing, since molecules of complexing agents typically have bonding groups that are electron donors, the regions of the corresponding molecules or ions from the reactant salt that become bonded to such complexing agents are electron acceptors. For example, reactant-salt ions typically are cationic, and can be actual polyatomic or monoatomic cations. It is also possible for molecules or ions of the reactant salt(s) to interact with the complexing agent by other bonding mechanisms such as hydrogen bonding.

The complexing agent can also interact with a reactant salt in other ways to facilitate dissolution of the reactant salt. For example, a complexing agent may interact with non-polar regions of ions or molecules of reactant salts by, for example, "hydrophobic" bonds.

The bonding of an ion or molecule of the reactant salt to the complexing agent must not be so strong that, during the crystallite-forming reaction, the ion or molecule cannot dissociate from the complexing agent. Release of the reactant-salt ion or molecule from the complexing-agent molecule to form the calcium carbonate product must be energetically favorable.

Especially preferred complexing agents are any of various crown ethers (i.e., any of various cyclic polyethers in which the ether groups are connected by methylene or silicon linkages and the ether oxygen atoms serve as electron donors). Representative crown ethers include, but are not limited to, 12-crown-4, 15-crown-5, 18-crown-6, dicyclohexyl-18-crown-6, and dibenzo-18-crown-6. Each crown ether binds a particular range of cations, depending upon the size of the central cavity of the crown ether molecule. Other possible complexing agents are discussed in U.S. Pat. No. 5,545,394, incorporated herein by reference. Other cyclic and acyclic polydentate complexing agents can be used, including, but not limited to, crown ether analogs containing other donor atoms in addition to or in place of oxygen atoms, such as 1,4,7,10-tetraazacyclododecane ("cyclen"), 1,4,8,11-tetraazacyclotetradecane ("cyclam"), and 1,4,7,10,13,16-hexathiacyclooctadecane; and acyclic chelating agents such as tris[2-2-methoxyethoxy)ethyl] amine, poly(ethylene glycols), and glymes.

The maximal amount of complexing agent to employ in a desired reaction system would be, for economic reasons, no greater than a stoichiometric amount relative to the amount of the corresponding reactant salt. Of course, if the complexing agent works "catalytically," substantially less than a stoichiometric amount would suffice.

In any event, a person of ordinary skill in the relevant art would be familiar with various complexing agents and how to go about selecting an appropriate complexing agent for a particular reactant salt and reaction solvent. Many candidate complexing agents are commercially available and can be tested for efficacy in a given reaction by a simple test-tube experiment. I.e., bench-top experiments to test the efficacy of a particular complexing agent are within the skill of persons of ordinary skill in the relevant art.

It is also comprehended that many complexing agents, such as (but not limited to) crown ethers, can be made more soluble in certain hydrophobic solvents by chemically attaching lipophilic moieties to molecules of the agents.

As stated above, reactant salts for forming calcium carbonate according to the present invention are normally soluble in water. Reaction solvents for use in reaction systems according to the present invention include any of various organic solvents that are less polar than water, particularly relatively non-polar organic solvents. Such reaction solvents include hydrophobic solvents and solvents that have some degree of hydrophilicity (normally less than water), and can comprise mixtures of organic solvents including such mixtures with water.

Representative reaction solvents, not intended to be limiting in any way, include polar aprotic solvents such as dimethylsulfoxide (DMSO) and dimethylformamide (DMF); ethereal solvents such as tetrahydrofuran (THF) and diethyl ether; alkanes, olefins, alkyl halides, alcohols, and ketones of up to 20 carbons; and aromatic, heteroaromatic, and aryl halide solvents of up to 20 carbons such as toluene, nitrobenzene, pyridine, and quinoline. These specific solvents, representing various types of organic solvents, indicate that any of a wide variety of organic solvents can be utilized, and that useful solvents are not limited to a particular class of solvents.

Since the reaction solvent is preferably a liquid under reaction conditions, this places a limit on the number of carbons, for example, molecules of the reaction solvent can have. Solvent compounds having a greater number of carbon atoms (greater than about 20) tend either not to be liquids or to be too viscous under reaction conditions to be of practical utility.

Choosing a reaction solvent can be somewhat empirical. Basically, if a reactant salt cannot be made to dissolve in the reaction solvent, even after attempting to facilitate dissolution using any of various complexing agents, a different reaction solvent should be selected. Sometimes, difficulties with a reaction solvent can be solved by simply using a different complexing agent. If dissolution of the reactant salt is too slow, agitation can be helpful, including use of an ultrasonicator.

The reaction system can include a gel support. Representative gels that are relatively polar include, but are not limited to, polyvinylacetate (PVAc) and poly(vinylalcohol) (PVA). In the usual instance where the reaction solvent is non-polar, any of various non-polar gels can be used, including any of various solvent-swollen organic polymer gels such as, but not limited to, poly(ethylene) gel, poly(styrene) gel, and poly(vinylchloride) (PVC) gel. For example, dissolution of 7–9% (w/w) of poly(vinylchloride) in DMSO at elevated temperature (ca. 80° C.), followed by cooling to room temperature, affords a suitable solvent-swollen polymer gel. A comparable gel is obtained with ca. 18% (w/w) of poly(vinylchloride) in DMF. A gel can facilitate the formation of large crystals. Also, use of a gel can have particular utility in two-phase reactions (i.e., reactions involving one solution layered atop another wherein the reaction occurs at the layer interface) according to the present invention, wherein the gel can serve to slow the rate of reaction and can simplify setting up the phases prior to onset of the reaction.

Inducing formation of the calcium carbonate product in a reaction system according to the present invention can be, and usually is, spontaneous. However, crystallization can be triggered by introducing a seed crystal or other nucleation aid to the system. A variety of conventional nucleation aids are available. Other nucleation aids include anion and cation exchange resins.

Other methods of inducing crystal formation include thermal shock, physical shock, and methods that achieve at least localized supersaturation. "Double-jet precipitation" has also been used successfully, wherein first and second solutions of reactant salts are added simultaneously to a stirred crystallizer.

The products of reactions according to the present invention are crystalline forms (i.e., "crystallites") of calcium carbonate. The crystallites can comprise an assemblage of individual calcium carbonate crystals that are microscopic in size. Generally, the faster the reaction, the smaller the crystals of the product.

The calcium carbonate crystallite products are not necessarily comprised of crystals larger than products of corresponding reactions performed according to the prior art. Rather, calcium carbonate crystallites formed according to the present invention comprise crystals that exhibit an altered habit and/or morphology compared to crystals formed according to the prior art. In the case of reactions according to the present invention forming calcium carbonate products consisting of smaller crystals, such crystallites can have unusual physical properties compared to crystallites consisting of larger crystals.

Preferred reactant salts capable of forming calcium carbonate products according to the present invention include, but are not limited to, the following:

Representative Calcium Sources

Calcium fluoride ($CaF_2$)
Calcium chloride ($CaCl_2$)
Calcium bromide ($CaBr_2$)
Calcium iodide ($CaI_2$)
Calcium perchlorate ($Ca(ClO_4)_2$)
Calcium tetrafluoroborate ($Ca(BF_4)_2$)
Calcium hydroxide ($Ca(OH)_2$)
Calcium nitrate ($Ca(NO_3)_2$)
Calcium sulfate ($CaSo_4$)
Calcium chlorate ($Ca(ClO_3)_2$)
Calcium bromate ($Ca(BrO_3)_2$)
Calcium iodate ($Ca(IO_3)_2$)
Calcium salts of monobasic acids: ($RCO_2)_2Ca$,
  wherein $RCO_2$=acetate, propanoate, butyrate, valerate, lactate, benzoate, salicylate, cinnamate, laurate, linoleate, oleate, palmate, stearate, etc.
Calcium salts of dibasic acids,
e.g., oxalate, fumarate, maleate, malonate, succinate, tartrate, etc.
Calcium 2,4-pentanedionate ($Ca(CH_3COCHCOCH_3)_2$)
Calcium hexafluoro-2,4-pentanedionate ($Ca(CF_3COFHCOCF_3)_2$)

Representative Carbonate Sources $M_2CO_3$ (M=Li, Na, K, Rb, Cs, $NH_4$)
$MM'CO_3$ (M, M'=Li, Na, K, Rb, Cs, $NH_4$, wherein M and M' are different)
$MHCO_3$ (M=Li, Na, K, Rb, Cs, $NH_4$)
$CO_2$+MOH (M=Li, Na, K, Rb, Cs, $NH_4$)
Any reactant salt can be either anhydrous or any of the various hydrates thereof.

The following examples are provided:

EXAMPLES 1–250

Although calcium chloride displays appreciable solubility in methanol (Hooper et al., in Pamplin (ed.), *Crystal*

*Growth*, 2d ed., p.395, Pergamon, New York, 1980), sodium bicarbonate is virtually insoluble in this solvent. However, sodium bicarbonate is readily solubilized in methanol by one equivalent of 1,4,7,10,13,16-hexaoxacyclooctadecane (18-crown-6), which efficiently chelates sodium ion (Li et al., *J. Am. Chem. Soc.* 116:3087–3096, 1994), and 0.13M solutions in methanol are easily obtained in this way.

These examples constitute an investigation into the production of novel calcium carbonate morphologies by solvent-solvent interdiffusion.

For each of examples 1–125, 10 mL of a methanolic sodium bicarbonate/18-crown-6 stock solution (0.13M in each component) was placed in a 30-mL glass test tube (pre-soaked in a 0.5M solution of EDTA for 12 hours to eliminate any metal ion contamination, then rinsed three times with deionized water and dried). In each tube, a glass-fiber filter paper (2.5 cm diameter; Whatman) was carefully placed on the surface of the solution Five mL of pure methanol was layered on the filter paper, then a second filter paper was placed on the surface of the methanol. Finally, 10 mL of a 0.13–0.15M solution of $CaCl_2$ in methanol was layered on the second filter paper. (Omission of the reaction-solvent layer (i.e., in this instance, the layer of methanol between the filter papers) can result in some instantaneous crystallization at the solution/solution interface.) Each tube was sealed with a latex septum and waterproof tape, then incubated at a constant temperature (8°, 21°, 38°, 50°, or 60° C.) for a specific reaction time (4, 12, 20, 28, or 36 days). To ensure reproducibility, five separate tubes were prepared for each combination of temperature and reaction time, yielding a total of 125 tubes.

For controls (Examples 126–250), a set of similar reactions were run in aqueous solution (i.e., no methanol or complexing agent). A total of 125 control tubes were run, with five tubes for each combination of temperature and reaction time.

After the respective incubation periods, precipitated calcium carbonate was isolated from each tube by filtration on 0.05-μm nylon filters, dried, and analyzed by X-ray powder diffraction (to assay phase) and scanning electron microscopy (to ascertain crystal habit). Energy-dispersive X-ray (EDX) analysis was also performed to probe for any crystal contamination by reactants. Selected Examples were also assayed by transmission electron microscopy (TEM) with selected area diffraction.

With respect to the controls (Examples 126–250), crystallization of calcium carbonate from aqueous solution at higher temperatures yielded calcite, generally as well-formed rhombohedral crystals and needles (FIG. 1). Longer reaction times at lower temperatures produced somewhat truncated analogs of rhombohedral and needle habits. At the highest temperature studied (60° C.), traces of aragonite were also observed.

Figure 2:
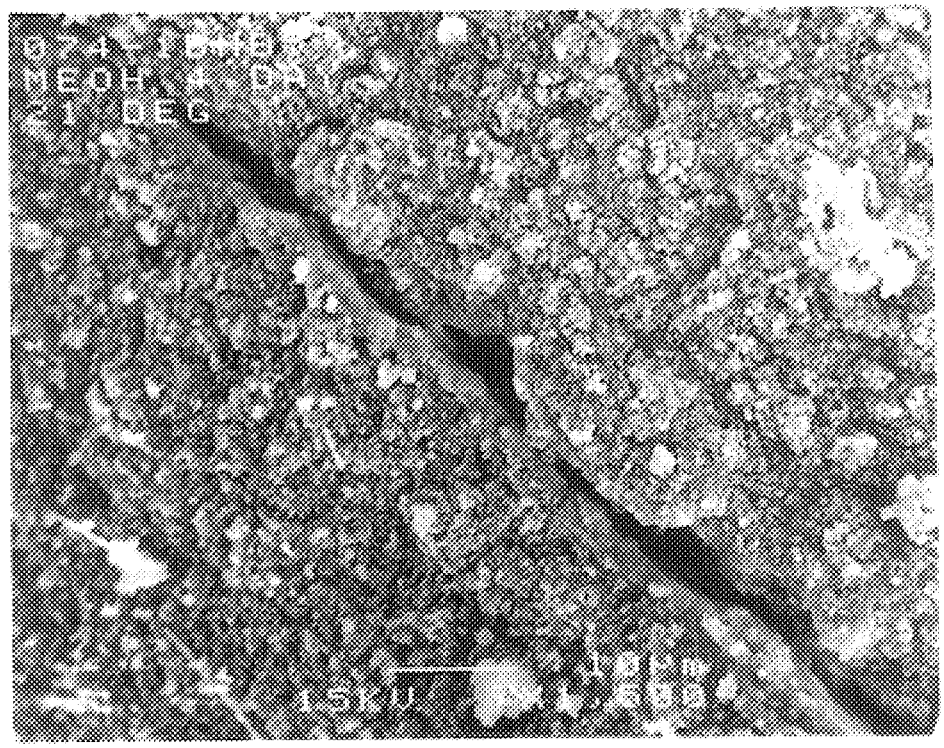
FIG. 2 is a photograph of a representative crystallite mass, consisting mostly of calcite, formed by reaction of calcium chloride with sodium bicarbonate in methanol in the presence of the complexing agent 18-crown-6 at 21° C. for 4 days.
Figure 3:
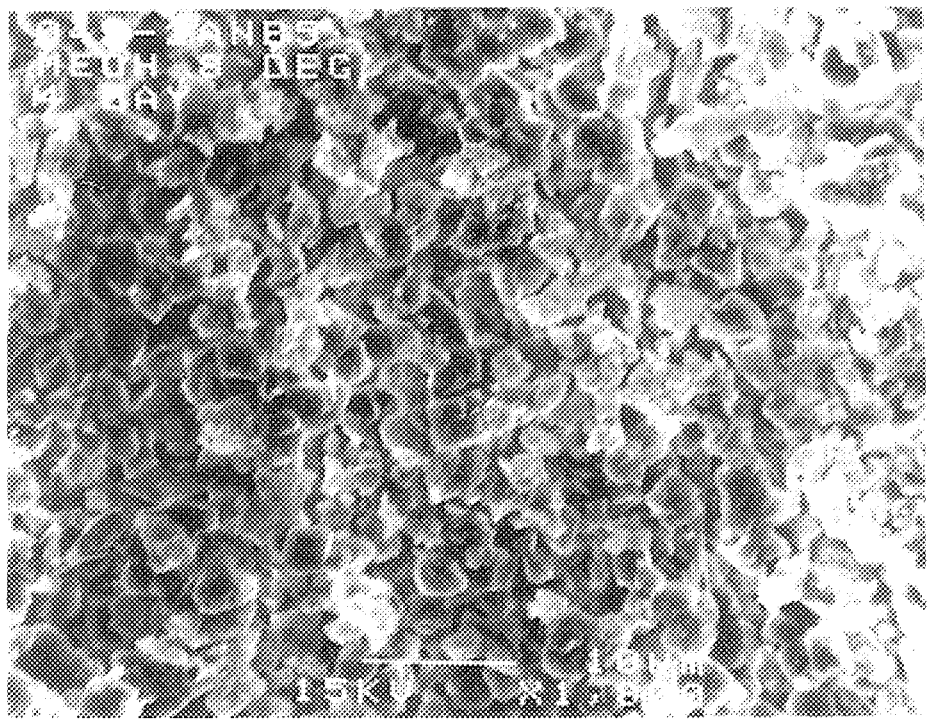
FIG. 3 is a photograph of rhombohedral crystallites present in a calcium carbonate crystallite formed by reaction of calcium chloride and sodium bicarbonate in methanol in the presence of the complexing agent 18-crown-6.
Figure 4:
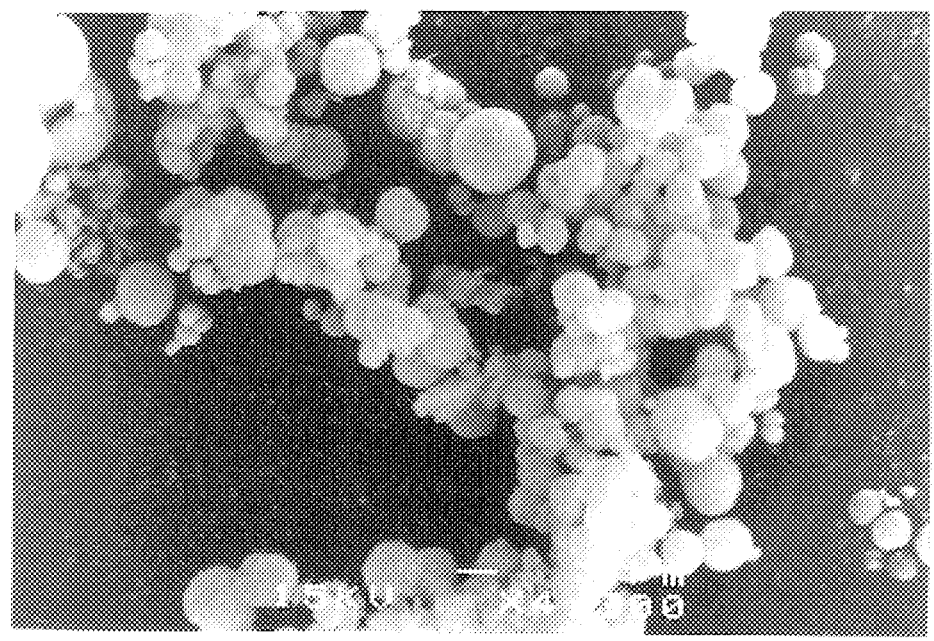
FIG. 4 is a photograph showing a typical aggregation of spherical vaterite formed by reaction of calcium chloride and sodium bicarbonate in methanol in the presence of the complexing agent 18-crown-6 at comparatively higher reaction temperatures and/or longer reaction times.
Figure 5:
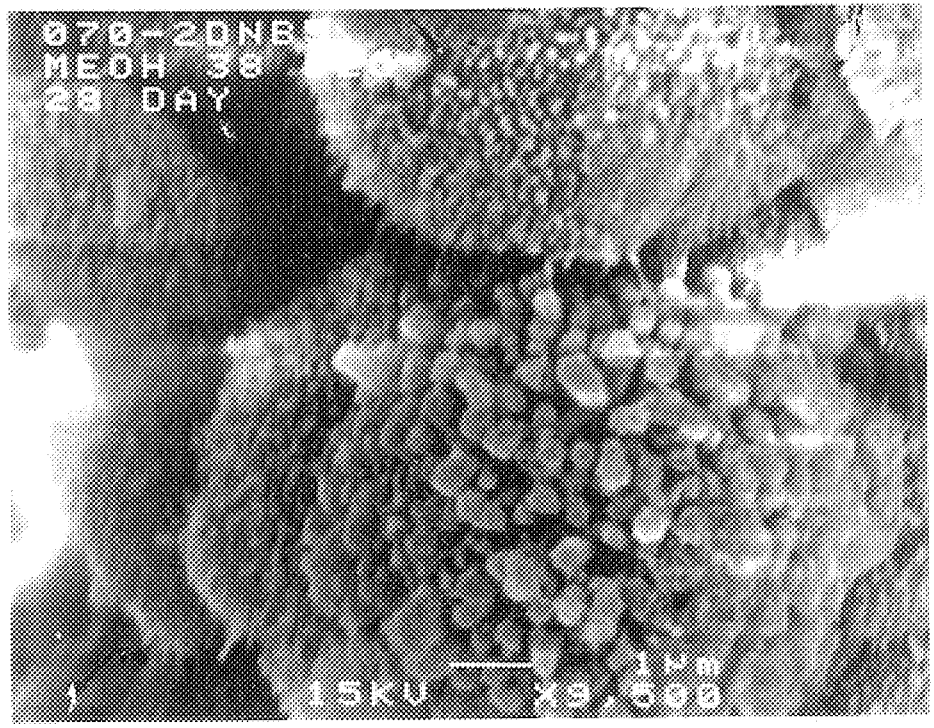
FIG. 5 is a closeup photograph of a vaterite sphere of the type shown in FIG. 4.
Figure 6:
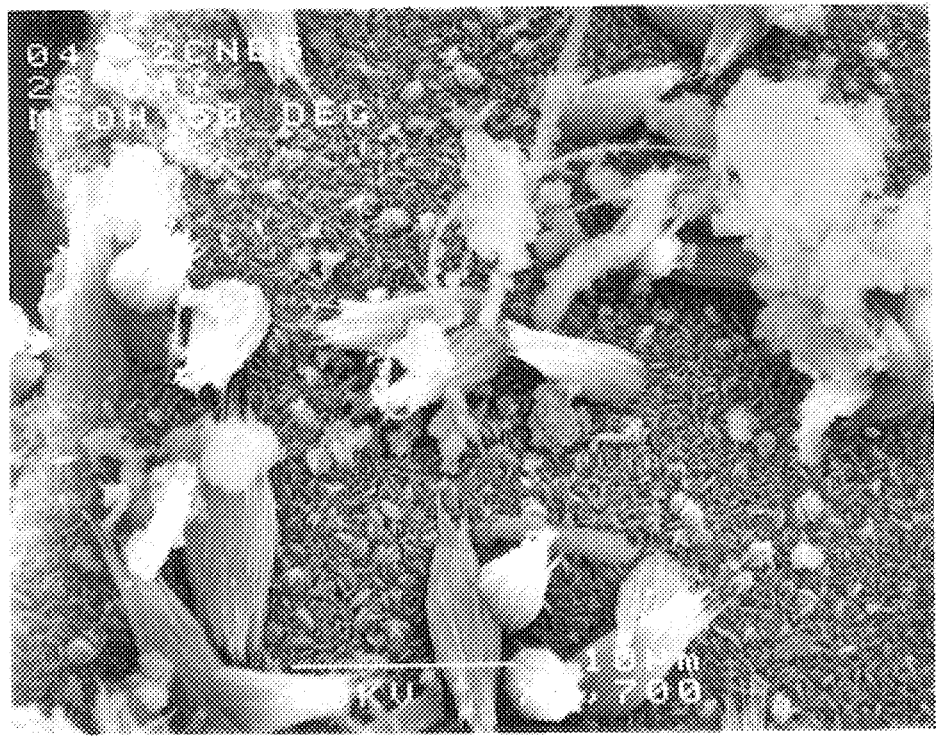
FIG. 6 is a photograph showing a new morphology of calcium carbonate formed by reaction of calcium chloride and sodium bicarbonate in methanol in the presence of the complexing agent 18-crown-6 for long growth periods (e.g., 28 days).

With respect to Examples 1–125, crystallization from methanol at lower temperatures (8° and 21° C.) for relatively short periods of time (4 and 12 days) produced mostly calcite (FIG. 2), as verified by X-ray powder diffraction and TEM with selected area diffraction. However, in contrast to the well-formed crystals obtained in the corresponding controls, crystallization from methanol generally produced roughly spherical aggregates of much smaller and more poorly formed rhombohedral crystallites (FIG. 3). Higher temperatures and/or longer reaction times resulted in the selective formation of the vaterite phase generally in the form of spherical aggregates (FIG. 4; closeup shown in FIG. 5) displaying much lower crystallinity (as evidenced by broad X-ray diffraction lines) than the calcite spheres. After long growth periods (e.g., 28days) at 21° C., a completely new fibrous habit was seen (FIG. 6). Growth at 8° C., which produced pure calcite after short reaction times, produced a ca. 1:1 mixture of calcite and vaterite after 20 days, and pure vaterite after a 36-day growth period, all as verified using X-ray powder diffraction. Growth at 38° C. produced pure vaterite within 4 days and thereafter.

Formation of vaterite in Examples 1–125 appeared to arise from transformation of the initially formed calcite to vaterite rather than by initial formation of a pulse of calcite followed by slower precipitation of vaterite. Thus, for example, growth at 21° C. for 12 days produced an average of 0.036 g of pure calcite, while growth for 36 days produced an average of 0.047 g of pure vaterite.

Also with respect to Examples 1–125, crystallization from methanol at 50° C. produced both vaterite, again as spherical aggregates, and aragonite in needle-like habits. At these higher temperatures, aragonite was observed even at the shorter reaction periods, and phase interconversion was not clearly indicated in these preparations.

The substantial reduction in calcite crystallite size observed after reaction in methanol probably represents, inter alia, a proportionate increase in nucleation versus growth rate in this non-aqueous solvent. This may be due to the lower viscosity of methanol versus water (affording higher diffusion rates) and the anticipated higher degree of supersaturation achieved in methanol (an intrinsically poorer solvent for these materials). With respect to the formation of vaterite at the expense of calcite, published $CaCO_3$ phase diagrams (Albright, *Amer. Miner.* 56:620–624, 1971) are somewhat sketchy about the stability regime for vaterite, and often omit this phase entirely (Liu et al., *Amer. Miner.* 75:801–806, 1990; Alam et al., *J. Am Ceram. Soc.* 73:733–735, 1990; Carlson, *Amer. Miner.* 65:1252–1262, 1980; Salje et al., *Contrib. Mineral. Petrol.* 55:55–67, 1976; Goldsmith et al., *Am. J. Sci.* 167A:160–190, 1969; Crawford et al., *Science* 144:1569–1570, 1964; Bell et al., *Carnegie Inst. Washington Yearb.* 63:177–179, 1963/1964; Simmons et al., *Science* 139:1197–1198, 1963; Clark, *Amer. Miner.* 42:564–565, 1957; Jamieson, *J. Geol.* 65:334–343, 1957; MacDonald, *J. Amer. Miner.* 41:744–751, 1956;and Jamieson, *J. Chem. Phys.* 21:1385–1390, 1953). Nevertheless, calcite is the thermodynamically favored bulk phase under ambient conditions (i.e., 1 atm pressure, near room temperature).

Therefore, surface effects (e.g., solvent-surface and/or crown ether-surface interactions) appear to be responsible for vaterite formation in the foregoing Examples, with very small vaterite crystallite size allowing surface-energy terms to overcome the intrinsic bulk thermodynamic stability of calcite. This conversion is aided by the initial formation of microcrystalline calcite; macroscopic calcite crystals, in contrast, in which bulk energy terms overwhelm surface energy terms, do not convert to vaterite even after prolonged contact with methanol/18-crown-6.

The foregoing studies highlight the ability of complexation-mediated crystallization to exploit simple solvent effects for the alteration of the crystal habit or morphology of calcium carbonate. These observations bear direct relevance to biomineralization. The foregoing studies demonstrate that even a comparatively simple change in solvent from water to methanol can exert a dramatic influence on calcium carbonate phase preference.

Whereas the present invention has been described in connection with preferred embodiments and numerous examples, it will be understood that the invention is not limited to those embodiments or examples. On the contrary, the invention is intended to encompass all alternatives, modifications, and equivalents as may be included within the spirit and scope of the invention as defined by the appended claims.

What is claimed is:

1. A method for forming a crystallite of calcium carbonate, the method comprising;
   (a) adding a calcium salt and a carbogate salt, at least one of the salts being substantially soluble in water, and a complexing agent to an essentially non-aqueous reaction solvent to form a reaction system, the calcium, salt and carbonate salt being reactive with each other in water to form a first crystallite of calcium carbonate, the complexing agent being soluble in the reaction solvent and being selected from a group consisting of crown ethers, tris(metboxyethoxyethyl)amines, poly (ethylene glycols), and glymes, the complexing agent being capable of forming chelation complexes with at least one of the salts in the reaction solvent, the calcium salt and carbonate salt being added to the reaction solvent for reaction with each other in the reaction system to form a calcium carbonate;
   (b) allowing the calcium salt and carbonate salt to react with each other in the reaction system to form a second crystalline precipitate, the second crystallite comprising crystals of calcium carbonate that have a different habit or morphology from calcium carbonate crystals in the calcium carbonate in the first crystallite that would otherwise be formable in water by reaction of the calcium salt and carbonate salt without the complexing agent.

2. The method of claim 1, wherein the reaction solvent is selected from a group consisting of polar aprotic solvents; alkanes, olefins, and alcohols, having up to 20 carbons; any of various mixtures of such solvents with each other; and any of various mixtures of such solvents with water.

3. The method of claim 2, wherein the polar aprotic solvent is selected from the group consisting of ethereal solvents having up to 20 carbons; alkyl halides and ketones having up to 20 carbons; aromatic, heteroaromatic, and aryl halide solvents having up to 20 carbons; and any of various mixtures of such solvents with each other.

4. The method of claim 1, wherein the reaction system further comprises a gel.

5. The method of claim 1, wherein the calcium salt is selected from a group consisting of calcium fluoride, calcium chloride, calcium bromide, calcium iodide, calcium perchlorate, calcium tetrafluoroborate, calcium hydroxide, calcium nitrate, calcium sulfate, calcium chlorate, calcium bromate, calcium iodate, calcium 2,4-pentanedionate, calcium hexafluoro-2,4-pentanedionate, calcium salts of monobasic acids of the formula $(RCO_2)_2Ca$ (wherein $RCO_2$, is acetate, propanoate, butyrate, valcrate, lactate, benzoate, salicylate, cinnamate, laurate, linoleate, oleate, palmate, and stearate), and calcium salts of dibasic acids; and
   (b) the carbonate salt is selected from a group consisting of compounds having the formula $M_2CO_3$ (wherein M is Li, Na, K, Rb, Cs, or $NH_4$); $MM'CO_3$(wherein M and M' are Li, Na, K, Rb, Cs, or $NH_4$, but not the same); $MHCO_3$,(wherein M is Li, Na, K, Rb, Cs, or $NH_4$); and $CO_2+MOH$ (wherein M is Li, Na, K, Rb, Cs, or $NH_4$).

6. The method of claim 1, wherein the complexing agent is selected from a group consisting of 12-crown-4, 15-crown-5, 18-crown-6, dicyclohexyl-18-crown-6, and dibenzo-18-crown-6.

7. The method of claim 1, wherein the reaction solvent is selected from a group consisting of polar aprotic solvents; alkanes, olefims, and alcohols, having up to 20 carbons; any of various mixtures of such solvents with each other; and any of various mixtures of such solvents with water.

8. A method for forming a crystallite of calcium carbonate, the method comprising:
   (a) adding a calciuim salt and carbonate salt to an essentially non-aqueous reaction solvent to form a reaction system, the calcium salt and carbonate salt being substantially soluble in water and being reactive with each other in water to form a first crystallite of calcium carbonate, at least one of the salts having a different solubility in the reaction solvent than in water, the calcium salt and carbonate salt being added to the reaction solvent for reaction with each other in the reaction system to form a calcium carbonate;
   (b) allowing the calcium salt and carbonate salt to react with each other in the reaction system to form a second crystallite precipitate, the second crystallite comprising crystals of calcium carbonate that have a different habit or morphology from calcium carbonate crystals in the calciun carbonate in the first crystallite that would otherwise be formable in water by reaction of the calcium salt and carbonate salt.

9. The method of claim 8, wherein the reaction system further comprises a complexing agent that is soluble in and can form chelation complexes with at least one of the salts in the reaction solvent, the complexing agent selected from a group of crown ethers, tris(methoxyethoxyethyl)amines, poly(etylene glycols), and glymes.

10. A method for forming a crystallite of calcium carbonate, the method comprising:
    (a) providing a calcium salt and a carbonate salt, at least one of said salts being substantially soluble in water, said salts reacting with each other in water to form a first crystallite of calcium carbonate;
    (b) providing a complexing agent that is soluble in and can form chelation complexes with the calcium salt in an organic solvent, the complexing agent being selected from a group consisting of crown ethers, tri(methoxyethoxyethyl)amines, poly(ethylene glycols), and glymes;
    (c) adding the calcium salt and carbonate salt along with the complexing agent to the organic solvent in a reaction system, the calcium salt and carbonate salt reacting with each other to form a calcium carbonate in the reaction system; and
    (d) allowing the calcium salt and carbonate salt to react with each other in the reaction system to form a second crystallite precipitate of the calcium carbonate in the organic solvent, the second crystallite precipitate comprising crystals of the calcium carbonate that have a different habit or morphology from crystals of the calcium carbonate in the first crystallite that would be formable in water by reaction of the salts without the complexing agent.

11. The method of claim 10, wherein the calcium salt is poorly soluble to insoluble in the organic reaction solvent, the complexing agent serving to facilitate dissolution of the calcium salt in the reaction solvent.

12. The method of claim 10, wherein the organic solvent is selected from a group consisting of polar aprotic solvents; alkanes, olefins, and alcohols, having up to 20 carbons; any of various mixtures of such solvents with each other; and any of various mixtures of such solvents with water.

13. The method of claim 12, wherein the polar aprotic solvent is selected from the group consisting of ethereal solvents having up to 20 carbons; alkyl halides and ketones having up to 20 carbons; aromatic, heteroaromatic, and aryl halide solvents having up to 20 carbons; and any of various mixtures of such solvents with each other.

14. The method of claim 10, wherein the reaction system further comprises a gel.

15. The method of claim 14, wherein the gel is selected from a group consisting of poly(vinylacetate), poly(vinylalcohol), poly(vinylchloride), poly(ethylene), and poly(styrene).

16. The method of claim 10, wherein:
  (a) the calcium salt is selected from a group consisting of calcium fluoride, calcium chloride, calcium bromide, calcium iodide, calcium perchlorate, calcium tetrafluoroborate, calcium hydroxide, calcium nitrate, calcium sulfate, calcium chlorate, calcium bromate, calcium iodate, calcium 2,4-penitanedionate, calcium hexafluoro-2,4-pentanedionate, calcium salts of monobasic acids of the formula $(RCO_2)_2Ca$ (wherein $RCO_2$ is acetate, propanoate, butyrate, valerate, lactate, benzoate, salicylate, cinnamate, laurate, linoleate, oleate, palmate, and stearate), and calcium salts of dibasic acids; and
  (b) the carbonate salt is selected from a group consisting of compounds having the formula $M_2CO_3$ (wherein M is Li, Na, K, Rb, Cs, or $NH_4$); $MM'CO_3$ (wherein M and M' are Li, Na, K, Rb, Cs, or $NH_4$ but not the same); $MHCO_3$ (wherein M is Li, Na, K, Rb, Cs, or $NH_4$); and $CO_2+MOH$ (wherein M is Li, Na, K, Rb, Cs, or $NH_4$).

* * * * *